(12) United States Patent
Koide et al.

(10) Patent No.: US 8,546,187 B2
(45) Date of Patent: Oct. 1, 2013

(54) ELECTRONIC PART AND METHOD OF MANUFACTURING THE SAME

(75) Inventors: Masateru Koide, Kawasaki (JP); Daisuke Mizutani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 56 days.

(21) Appl. No.: 12/857,884

(22) Filed: Aug. 17, 2010

(65) Prior Publication Data

US 2011/0042806 A1   Feb. 24, 2011

(30) Foreign Application Priority Data

Aug. 20, 2009  (JP) .................................. 2009-191271

(51) Int. Cl.
*H01L 21/768* (2006.01)
(52) U.S. Cl.
USPC ......................................... 438/108; 257/685
(58) Field of Classification Search
USPC .......... 257/686, 777, 685, 737; 438/108–109
See application file for complete search history.

(56) References Cited

U.S. PATENT DOCUMENTS

| | | | |
|---|---|---|---|
| 5,796,165 A | 8/1998 | Yoshikawa et al. | |
| 7,462,509 B2 * | 12/2008 | Bernstein et al. | 438/107 |
| 7,592,691 B2 * | 9/2009 | Corisis et al. | 257/686 |
| 7,592,694 B2 * | 9/2009 | Pan et al. | 257/692 |
| 7,598,605 B2 * | 10/2009 | Akiyama et al. | 257/685 |
| 7,939,950 B2 * | 5/2011 | Wu et al. | 257/784 |
| 8,174,103 B2 * | 5/2012 | Bartley et al. | 257/685 |
| 8,227,927 B2 * | 7/2012 | Chen et al. | 257/797 |
| 2001/0002727 A1 * | 6/2001 | Shiraishi et al. | 257/685 |
| 2002/0074637 A1 * | 6/2002 | McFarland | 257/686 |
| 2009/0267238 A1 * | 10/2009 | Joseph et al. | 257/777 |

FOREIGN PATENT DOCUMENTS

| | | |
|---|---|---|
| JP | 05-275570 A | 10/1993 |
| JP | 06-283661 | 10/1994 |
| JP | 08-321567 | 12/1996 |
| JP | 09-064252 A | 3/1997 |
| JP | 11-067963 | 3/1999 |
| JP | 11-163249 | 6/1999 |

OTHER PUBLICATIONS

Notification of Reasons for Refusal dated Feb. 12, 2013 corresponding to Japanese Patent Application No. 2009-191271 and English translation thereof.

* cited by examiner

*Primary Examiner* — Nathan Ha
(74) *Attorney, Agent, or Firm* — Squire Sanders (US) LLP (57) ABSTRACT

A method of manufacturing a multi-chip module includes: securing a plurality of chips on a surface of a flat-shaped member through a solder bump; connecting the plurality of chips with each other by a bonding wire, at surfaces, opposite to the flat-shaped member side, of the plurality of chips; and electrically connecting the plurality of chips with a board, at the surfaces, opposite to the flat-shaped member side, of the plurality of chips.

6 Claims, 7 Drawing Sheets

ELECTRONIC PART AND METHOD OF MANUFACTURING THE SAME

CROSS-REFERENCE TO RELATED APPLICATIONS

This application is based upon and claims the benefit of priority of the prior Japanese Patent Application No. 2009-191271, filed on Aug. 20, 2009, the entire contents of which are incorporated herein by reference.

FIELD

Embodiments discussed herein are related to a multi-chip module and a method of manufacturing the same.

BACKGROUND

There is known a semiconductor chip module called multi-chip module (MCM). In a conventional multi-chip module, multiple silicon chips which have been manufactured by separate processes are horizontally packaged onto a unifying substrate. Bare silicon chips are exposed, and are respectively connected with each other through a wiring formed on a ceramic or a build-up board (See for example Japanese Unexamined Patent Publication No. 6-283661).

However, in order to secure a substantial channel area in response to the wiring specification of the ceramic or the build-up board in JP-A-6-283661, a clearance between adjacent chips has to be large.

Additionally, the accuracy of the connection between the chips directly influences a non-defective rate (yield) of the multi-chip module, so it is important to retain the high accuracy of the connection.

SUMMARY

According to an aspect of the embodiments, a method of manufacturing a multi-chip module includes: securing a plurality of chips on a surface of a flat-shaped member through a solder bump; connecting the plurality of chips with each other by a bonding wire, at surfaces, opposite to the flat-shaped member side, of the plurality of chips; and electrically connecting the plurality of chips with a board, at the surfaces, opposite to the flat-shaped member side, of the plurality of chips.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
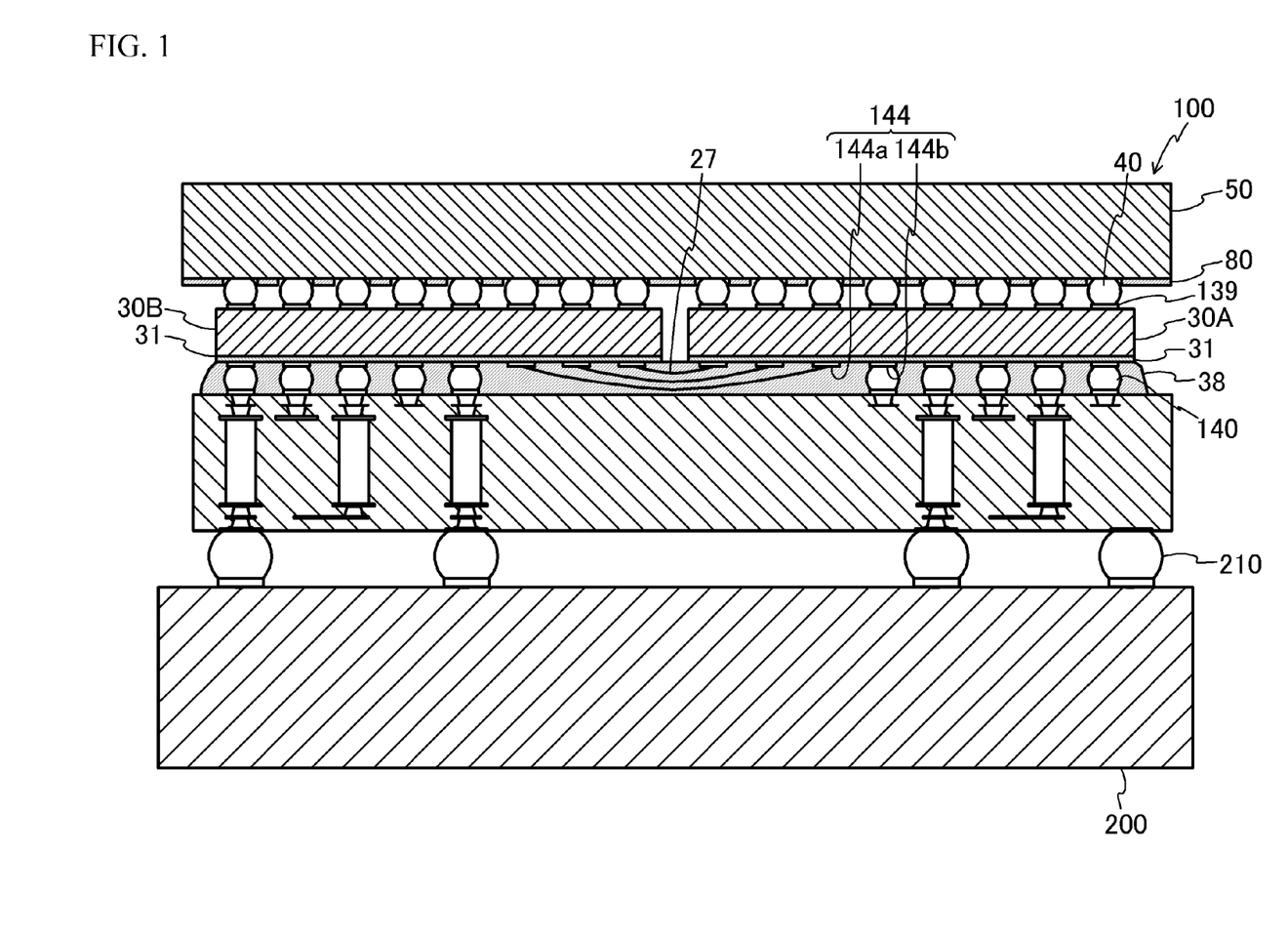
FIG. 1 is a cross sectional view of schematically illustrating a multi-chip module according to an embodiment.

The following description will be given of a multi-chip module and a method of manufacturing the multi-chip module according to an embodiment, with reference to FIGS. 1 to 6B. FIG. 1 is a cross sectional view of schematically illustrating a multi-chip module 100 according to an embodiment. The multi-chip module 100 is secured on a motherboard 200 through solder bumps 210, as illustrated in FIG. 1.

Figure 2:
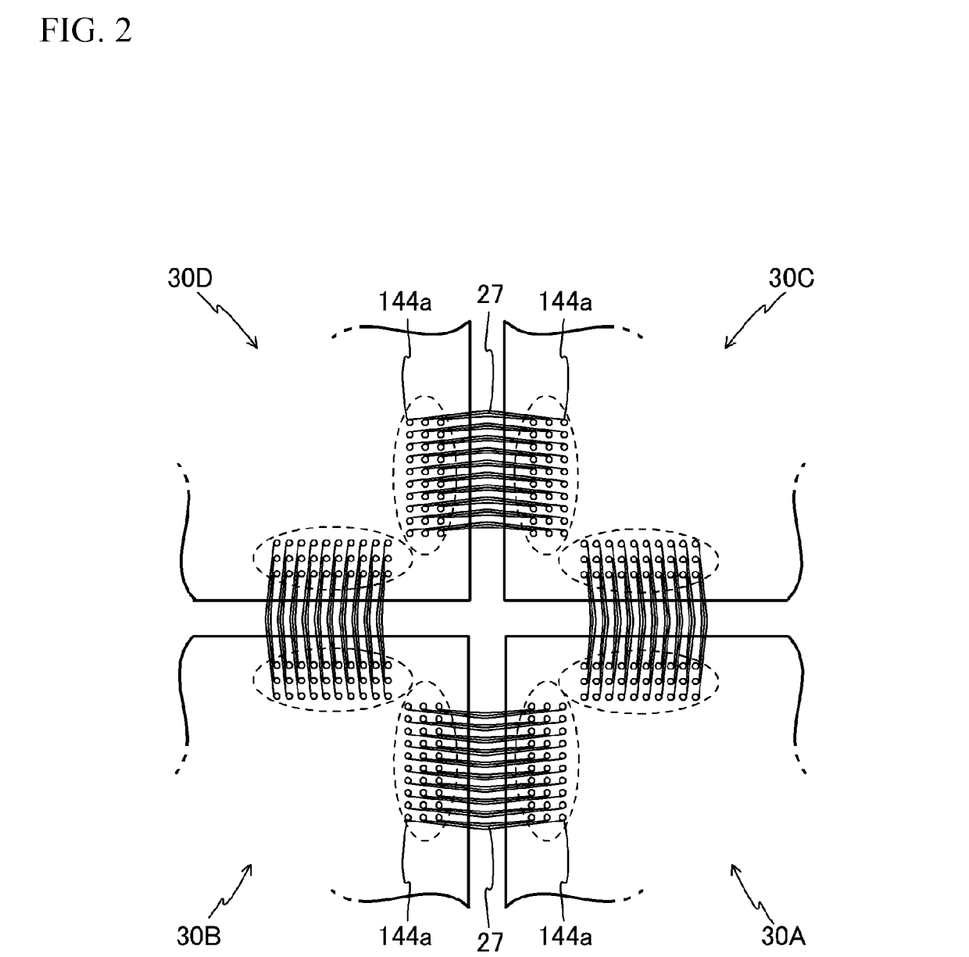
FIG. 2 is a plan view of a connection state by bonding wires.

The multi-chip module 100 includes: a package board 10; four LSI chips 30A to 30D as chips; and a heat spreader 50 as a flat-shaped member. The LSI chips 30C and 30D are illustrated in FIG. 2.

The package board 10 is called as build-up board. The package board 10 is a multilayer board including: a board having wiring layers and called core board; and wiring layers formed on front and rear surfaces of the board. For example, the core board has four wiring layers, and the first to third wiring layers are provided on the front and rear surfaces of the board. The wiring formed in the package board 10 connects the motherboard 200 with the LSI chips 30A to 30D. Examples of the material of the board may be an epoxy resin, polyimide, or ceramic. An example of the material of the wiring is copper.

Each of the LSI chips 30A to 30D includes: a chip forming member composed of a silicon wafer; and a thin film 31 formed on the chip forming member, wiring patterns being formed in the thin film 31. Hereinafter, the thin films 31 of the LSI chips 30A to 30D are referred to as thin film circuits 31. The LSI chips 30A to 30D are secured on the package board 10 through the solder bumps 140. The vicinity of the solder bumps 140, that is, the clearance between the LSI chips 30A to 30D and the package board 10, is sealed with a resin (underfill material) 38.

Plural pads 144 are provided on a bottom surface, near the package board 10 side, of the thin film circuits 31, as illustrated in FIG. 1. Among these pads 144, pads 144a, surrounded by a broken line, are connected through bonding wires 27 with pads 144a, surrounded by a broken line with another chip's pads 144a, around which a broken line surrounds, on another chip. The bonding wires 27 connect the pads 144a of the LSI chips 30A to 30D with each other to electrically connect the LSI chips 30A to 30D with each other. Additionally, in FIG. 2, the bonding wires 27 connect the LSI chip 30A with the LSI chips 30B and 30C and also connect the LSI chips 30D with the LSI chips 30B and 30C. On the other hand, pads 144b electrically connect the package board 10 and the LSI chips 30A to 30D through the solder bumps 140, as illustrated in FIG. 1. In addition, the clearance between the LSI chips 30A to 30D and the package board 10 is sealed with a resin (underfill material) 38. This resin 38 has a dielectric constant and a dielectric loss without the influence on the operation of the LSI. Plural pads 139 are provided on the upper sides of the LSI chips 30A to 30D.

The heat spreader 50 is a flat-shaped member having upper and lower flat surfaces and made of a metal such as copper. This heat spreader 50 is secured on the upper surfaces of the LSI chips 30A to 30D through solder bumps 40 for thermal junction. The heat spreader 50 has a function of radiating the heat generated in the LSI chips 30A to 30D. Further, solder resist 80 is provided at sections, where the solder bumps 40 are not provided, of the lower surface of the heat spreader 50.

In such a multi-chip module 100 configured above, the LSI chips are connected through the bonding wires 27 with each other. Thus, the LSI chips 30A to 30D are electrically connected with the package board 10 through the pads 144b, and all of the LSI chips 30A to 30D can be handled as a single large-sized LSI chip.

Next, a method of manufacturing the multi-chip module 100 will be described with reference to FIGS. 3A to 6B.

Figure 3A:
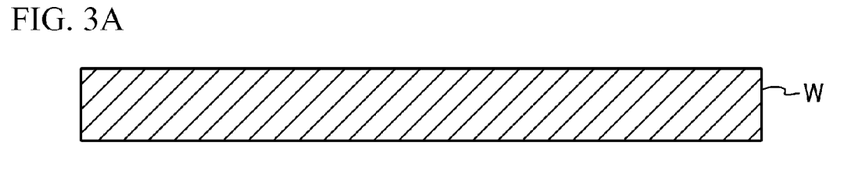
FIGS. 3A to 3E are explanatory views of a method of manufacturing the multi-chip module.
Figure 3B:
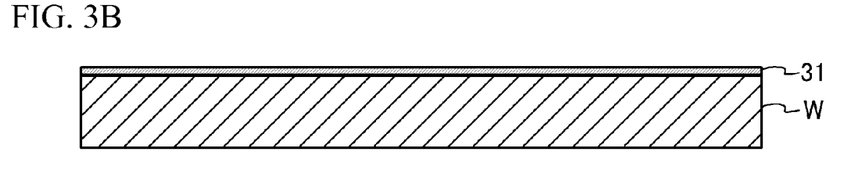
Figure 3C:
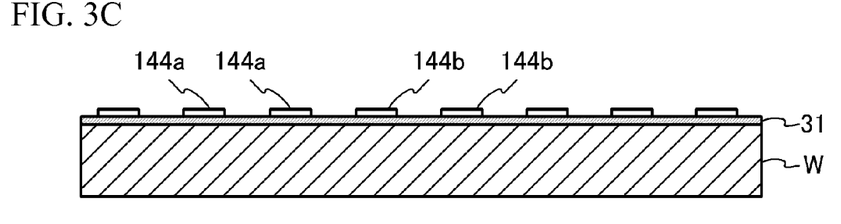
Figure 3D:
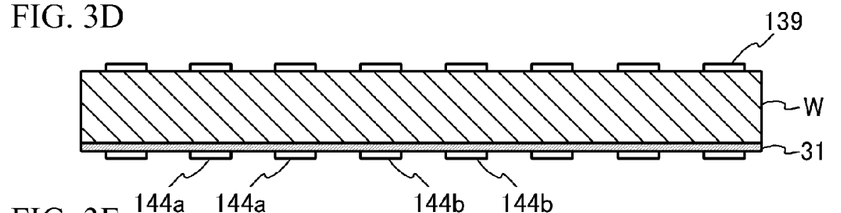
Figure 3E:
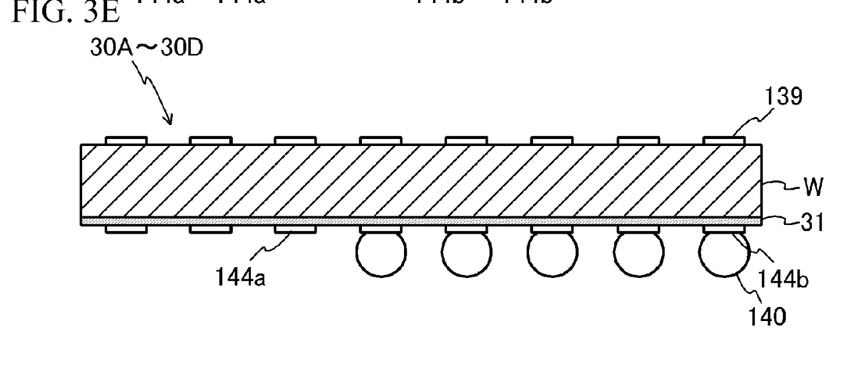

First, a description will be given of a method for manufacturing the LSI chips 30A to 30D with reference to FIGS. 3A to 3E. In the production of the LSI chips 30A to 30D, a silicon wafer W is prepared, and the thin film circuit 31 is formed on an upper surface of the silicon wafer W as illustrated in FIG. 3B. In the formation of the thin film circuit 31, a semiconductor manufacturing equipment such as a semiconductor exposure apparatus is used. Next, pads 144a and 144b are formed on the thin film circuit 31 by plating a metal such as copper, as illustrated in FIG. 3C. Then, pads 139 are formed on a surface, of the silicon wafer W, opposite to the thin film circuit 31 side. Additionally, the silicon wafer W has to be diced into a predetermined size, after or before the process illustrated in FIG. 3D is accomplished. The silicon wafer W becomes the LSI chips 30A to 30D after dicing. Then, the solder bumps 140 are respectively formed on the pads 144b of the LSI chips 30A to 30D, as illustrated in FIG. 3E. Additionally, the silicon wafer W may be diced after the solder bumps 140 are formed.

Figure 4A:
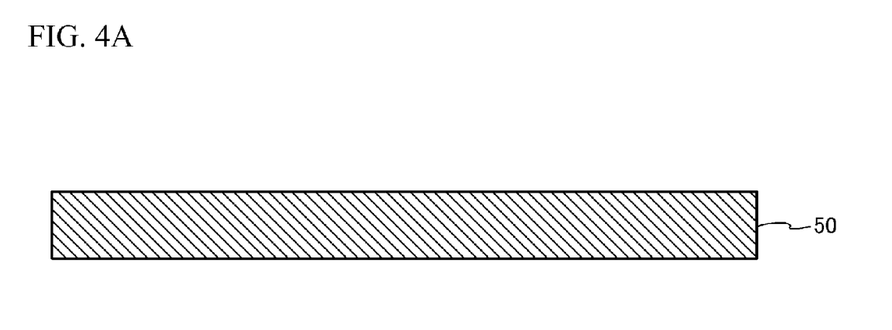
FIGS. 4A to 4D are explanatory views of the method of manufacturing the multi-chip module.
Figure 4B:
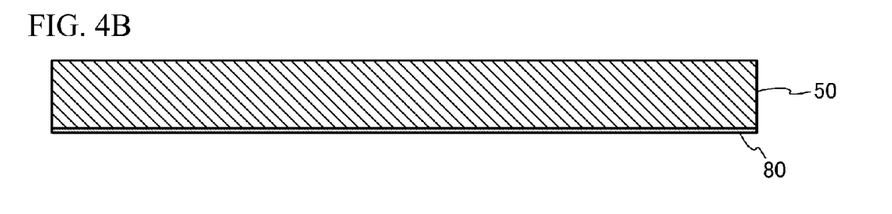
Figure 4C:
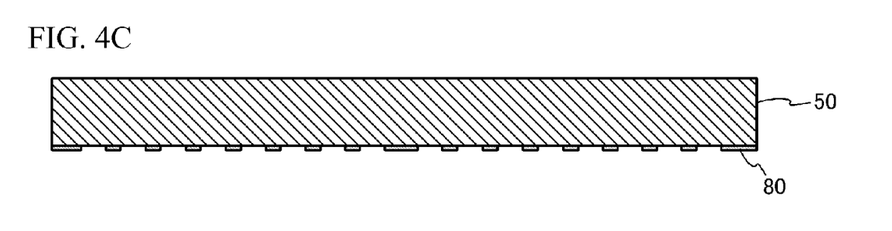
Figure 4D:
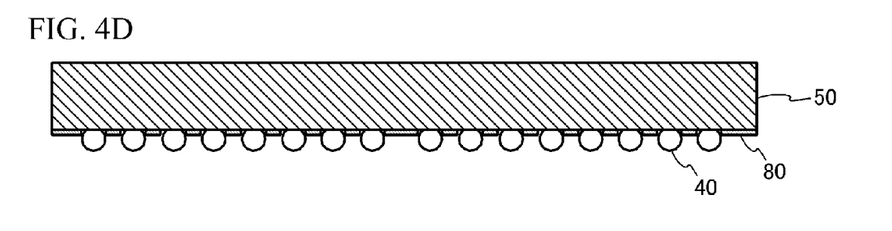

Next, the heat spreader 50 is prepared as illustrated in FIG. 4A. Next, the solder resist 80 is pasted on a lower surface of the heat spreader 50. Then, a lot of openings are provided in the solder resist 80, after the processes of exposure and development. In addition, the lower surface (metallic surface) is exposed in the openings. Thus, preferably the metallic surface should be rust-proofed. Next, the solder bumps 40 are formed in the openings of the solder resist 80, as illustrated in FIG. 4D.

Figure 5A:
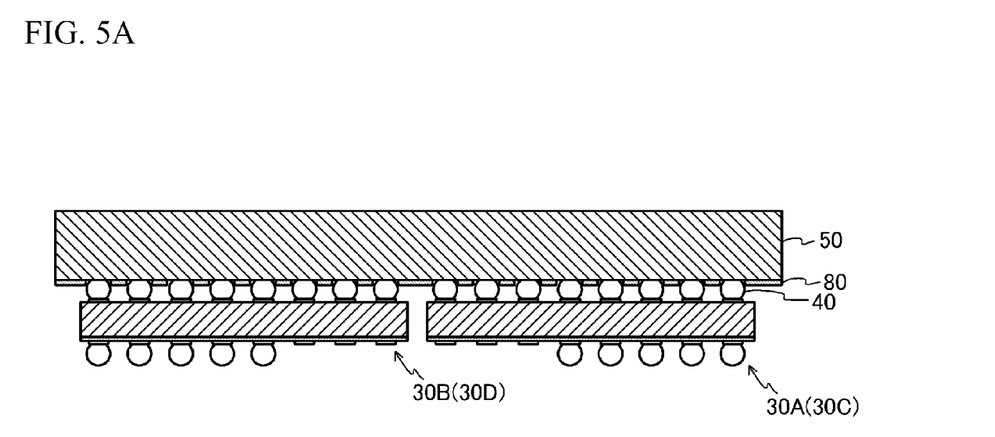
FIGS. 5A and 5B are explanatory views of the method of manufacturing the multi-chip module.

As illustrated in FIG. 5A, the LSI chips 30A to 30D are arranged on the lower surface of the heat spreader 50. In this case, the solder bumps 40 are heated with the LSI chips 30A to 30D and the heat spreader 50 being in contact with each other through the solder bumps 40, so that the heat spreader 50 and the solder bumps 40 are secured. In this state, the LSI chips 30A to 30D are secured on the flat surface (lower surface) of the heat spreader 50. Thus, the lower surfaces of the LSI chips 30A to 30D are flush with each other.

Figure 5B:
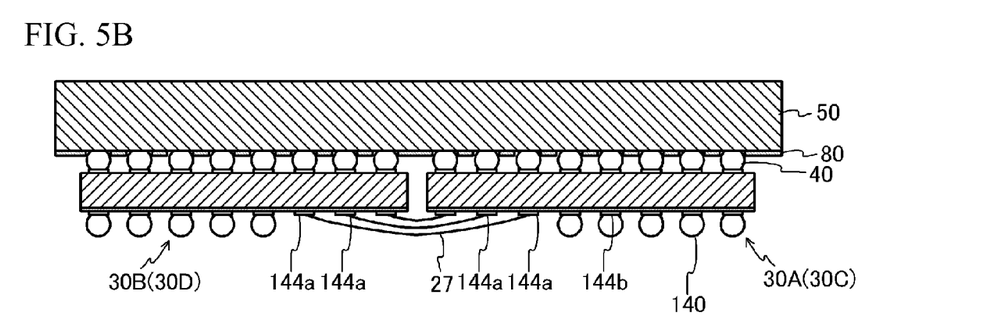

As illustrated in FIG. 5B, the LSI chips 30A to 30D are electrically connected with each other through the bonding wires 27 (a wire bonding process). The wire bonding process is conducted in the state where the LSI chips 30A to 30D are already secured on the heat spreader 50. Therefore, the wire bonding can be performed in the state where the lower surfaces of the LSI chips 30A to 30D are flush with each other. This allows the electrical connection between the LSI chips 30A to 30D with accuracy.

Figure 6A:
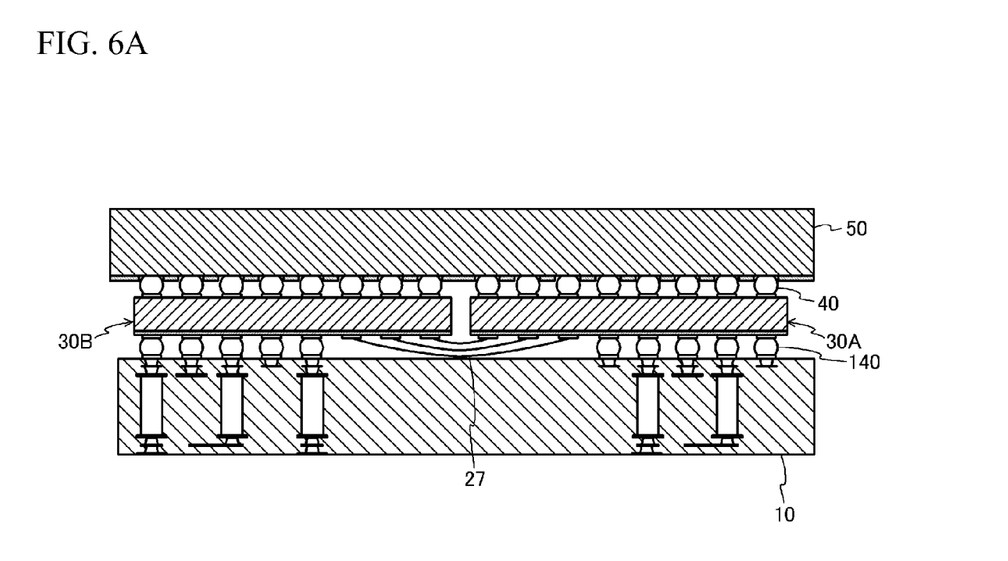
FIGS. 6A and 6B are explanatory views of the method of manufacturing the multi-chip module.
Figure 6B:
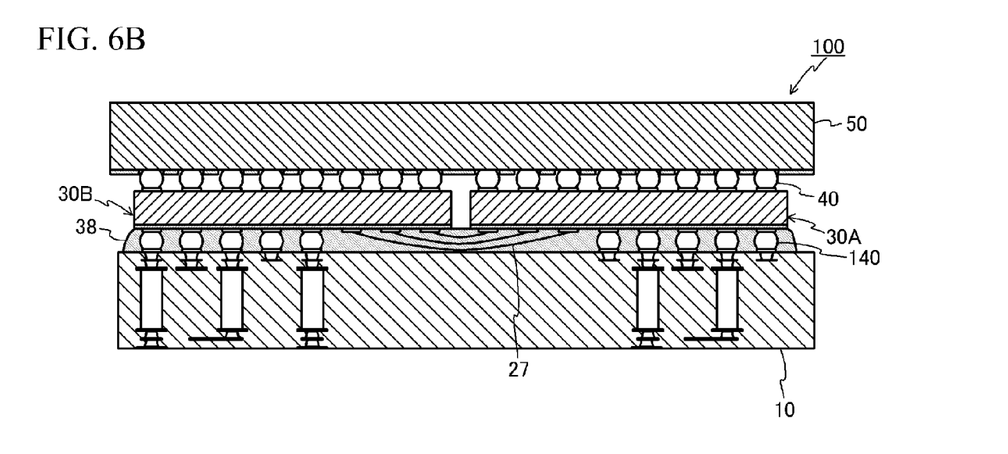

As illustrated in FIG. 6A, the structure illustrated in FIG. 5B is mounted on the package board 10 (is jointed through the solder bumps 140). Then, as illustrated in FIG. 6B, the clearance between the package board 10 and the LSI chips 30A to 30D are sealed with the resin 38. Accordingly, the production of the multi-chip module 100 is achieved.

After that, the multi-chip module 100 which has been manufactured in the above manner is secured on the motherboard 200 through the solder bumps 210, as illustrated in FIG. 1.

As described above, in the embodiment, the plural LSI chips 30A to 30D are secured on one surface (the lower surface illustrated in FIG. 5A) of the flat-shaped heat spreader 50 through the solder bumps 40. Next, the chips are connected with each other through the bonding wires 27, on the surfaces (the lower surfaces illustrated in FIG. 5B), opposite to the heat spreader 50 side, of the LSI chips 30A to 30D. Then, the package board 10 is electrically connected with surfaces (the lower surfaces illustrated in FIG. 6A), opposite to the heat spreader 50 side, of the LSI chips 30A to 30D. Thus, in the state where the LSI chips 30A to 30D are already secured on the heat spreader 50, that is, where the heights of the lower surfaces of the LSI chips 30A to 30D are substantially matched with each other, the wires can be bonded. This ensures the connection between the LSI chips through the bonding wires 27 with accuracy. Accordingly, the yield of the multi-chip module 100 is improved.

Further, in the present embodiment, the LSI chips 30A to 30D are connected with each other through the bonding wires 27, and these chips are handled as a single large-sized LSI chip. Thus, as compared with a case where large chips are manufactured, it is unnecessary to use a large-sized manufacturing equipment. Therefore, the cost can be decreased with a simple technology.

In the present embodiment, the clearance between the package board 10 and the LSI chips 30A to 30D is sealed with the resin 38, after the package board 10 is electrically connected with the LSI chips 30A to 30D. Thus, by employing a resin, which has a dielectric constant and a dielectric loss without having the influence on the operation of the LSI, as the resin 38, transmission efficiency of the bonding wire can be kept high.

Further, the solder bumps 40 are provided between the plural LSI chips 30A to 30D and the heat spreader 50. Herein, the diameters of the solder bumps 40 can be substantially constant. Therefore, the LSI chips 30A to 30D and the heat spreader 50 are secured with the lower surfaces of the LSI chips 30A to 30D kept flush with each other. Furthermore, in the present embodiment, the solder bumps 40 are provided between the LSI chips 30A to 30D and the heat spreader 50. Therefore, the heat generated in the LSI chips 30A to 30D can be effectively transmitted to the heat spreader 50 through the solder bumps 40.

Moreover, in the present embodiment, the bonding wires 27 are connected with the thin film circuits 31 of the LSI chips 30A to 30D (the lower surfaces of the LSI chips 30A to 30D). Accordingly, it is only necessary to form a circuit for connection on the thin film circuit 31, thereby allowing the simple formation of the section with which the bonding wires 27 are connected simply.

Figure 7A:
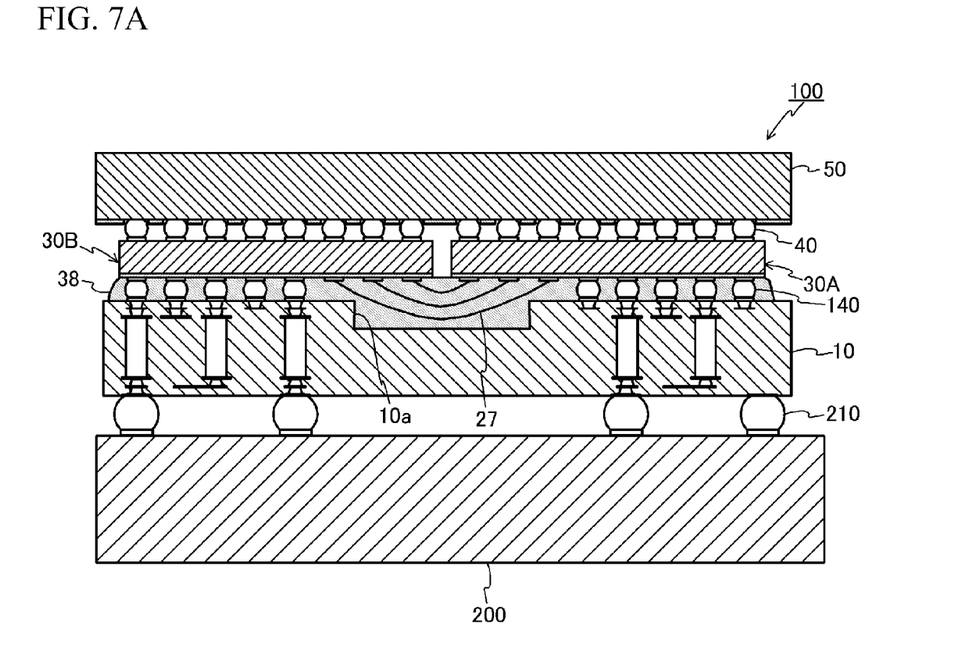
FIGS. 7A and 7B are explanatory views of the method of manufacturing the multi-chip module.
Figure 7B:
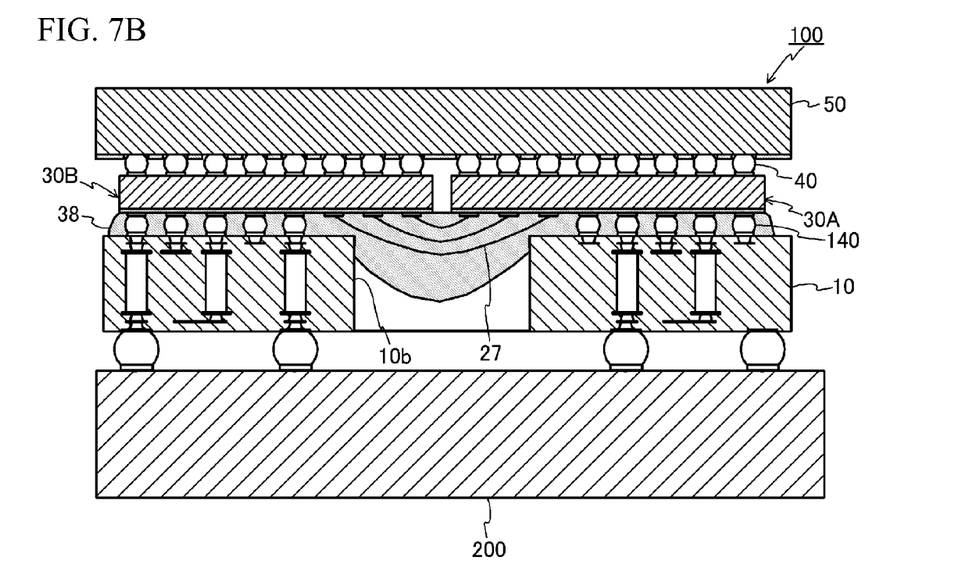

Additionally, the above embodiment has been described a case where the package board 10 is a flat-shaped board. However, the embodiment is not limited to the package board 10. For example, the package board 10 may be provided with a recess portion 10a, for avoiding the interference with the bonding wires 27, at a section near the bonding wires 27, as illustrated in FIG. 7A. Alternatively, for example, the package board 10 may be provided with a through hole 10b, as illustrated in FIG. 7B. In this case, the entire of through hole 10b need not be filled with the resin 38, as illustrated in FIG. 7B.

In the above embodiment, the heat spreader 50 and the LSI chips 30A to 30D are secured by the solder bumps 40. However, the embodiment is not limited to this arrangement. In addition to this arrangement, the clearance between the heat spreader 50 and the LSI chips 30A to 30D may be filled with a resin having thermal conductivity. Thus, the heat generated in the LSI chips 30A to 30D can be effectively transmitted to the heat spreader 50.

The above embodiment has described the resin 38 provided between the LSI chips 30A to 30D and the package board 10.

However, the embodiment is not limited to the resin 38. The resin 38 may not be provided. Further, the above embodiment has described the wire is bonded with the LSI chips 30A to 30D secured on the lower surface of the heat spreader 50. However, the embodiment is not limited to the heat spreader 50. The wire may be bonded with the LSI chips 30A to 30D secured on a flat-shaped member other than the heat spreader 50.

The above embodiment has described a case where four LSI chips are provided. However, the embodiment is not limited to such a case. Arbitrary number of the LSI chips may be provided. The above embodiment has described the LSI chip as a chip. However, the embodiment is not limited to the LSI chip. Another type of chip may be employed.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. A method of manufacturing an electronic part, comprising:
    securing first surfaces of a plurality of chips on a surface of a single flat-shaped member through solder bumps;
    connecting second surfaces of the plurality of chips with each other by a bonding wire, wherein the bonding wire is disposed externally to the second surfaces, the flat-shaped member, and a board, the second surfaces not facing the flat-shaped member side; and
    electrically connecting the second surfaces of the plurality of chips with a board.

2. The method of claim 1, further comprising sealing a clearance between the board and the plurality of chips with a resin after said electrically connecting the plurality of chips with the board.

3. An electronic part comprising:
    a board;
    a plurality of chips each comprising a first surface and a second surface, the second surfaces of the plurality of chips electrically connected with the board, the plurality of chips disposed on the board; and
    a bonding wire through which the second surfaces of the plurality of chips are connected with each other, wherein the bonding wire is disposed externally to the second surfaces and the board, and wherein,
    the first surfaces of the plurality of chips are oriented in a same direction.

4. The electronic part of claim 3, further comprising a single flat-shaped member provided at the first surfaces of the plurality of chips through solder bumps.

5. The electronic part of claim 3, wherein the board is configured to have a shape for avoiding interference with the bonding wire.

6. The electronic part of claim 3, wherein a clearance between the board and the plurality of chips is sealed with resin material.

* * * * *